US00RE47292E

(19) United States
(12) Reissued Patent
Yoneda et al.

(10) Patent Number: US RE47,292 E
(45) Date of Reissued Patent: Mar. 12, 2019

(54) MOS SEMICONDUCTOR DEVICE

(71) Applicant: KABUSHIKI KAISHA TOSHIBA, Tokyo (JP)

(72) Inventors: Tatsuo Yoneda, Hyogo (JP); Bungo Tanaka, Kanagawa (JP)

(73) Assignee: Kabushiki Kaisha Toshiba, Tokyo (JP)

(21) Appl. No.: 15/185,830

(22) Filed: Jun. 17, 2016

Related U.S. Patent Documents

Reissue of:
(64) Patent No.: 6,690,061
Issued: Feb. 10, 2004
Appl. No.: 10/253,522
Filed: Sep. 25, 2002

(30) Foreign Application Priority Data

Sep. 26, 2001 (JP) ..... 2001-293928

(51) Int. Cl.
*H01L 29/76* (2006.01)
*H01L 29/78* (2006.01)
*H01L 27/088* (2006.01)
*H01L 29/45* (2006.01)

(52) U.S. Cl.
CPC ..... *H01L 29/7813* (2013.01); *H01L 27/088* (2013.01); *H01L 29/456* (2013.01); *H01L 2224/13* (2013.01); *H01L 2224/48247* (2013.01); *H01L 2224/49111* (2013.01); *H01L 2224/49175* (2013.01); *H01L 2924/13091* (2013.01); *H01L 2924/181* (2013.01)

(58) Field of Classification Search
CPC .. H01L 29/7813; H01L 27/088; H04M 10/20; H04M 10/22
See application file for complete search history.

(56) References Cited

U.S. PATENT DOCUMENTS 5,321,289 A * 6/1994 Baba et al. ..... 257/331
5,925,910 A * 7/1999 Menegoli ..... 257/335
6,057,588 A * 5/2000 Yamazaki ..... 257/506
6,137,135 A * 10/2000 Kubo et al. ..... 257/328
(Continued)

FOREIGN PATENT DOCUMENTS

DE 19620625 C1 * 10/1997 ..... H01L 21/8242
JP 9-260648 10/1997
JP H09260648 A 10/1997
(Continued)

*Primary Examiner* — Ling X Xu
(74) *Attorney, Agent, or Firm* — Kim & Stewart LLP

(57) ABSTRACT

The semiconductor device according to an aspect of the present invention includes: a semiconductor substrate of a first conductive type; a first semiconductor layer of the first conductive type formed on the main surface of the semiconductor substrate, the impurity concentration of the first semiconductor layer being lower than that of the semiconductor substrate; a second and third semiconductor layers of a second conductive type formed on the first semiconductor layer, the second and third semiconductor layers being isolated from each other; a first and second MOS transistors MOS1 and MOS2 of the first conductive type formed in the second and third semiconductor layers, the first semiconductor layer and the semiconductor substrate serving as drains of the first and second MOS transistors; and a conductive layer.

20 Claims, 7 Drawing Sheets

(56) References Cited

U.S. PATENT DOCUMENTS

| | | | | |
|---|---|---|---|---|
| 6,297,101 | B1 * | 10/2001 | Schaeffer | 438/268 |
| 6,509,607 | B1 * | 1/2003 | Jerred | 257/330 |

FOREIGN PATENT DOCUMENTS

| | | | |
|---|---|---|---|
| JP | 10-173175 | | 6/1998 |
| JP | H10173175 | A | 6/1998 |
| JP | 11-154748 | | 6/1999 |
| JP | H11154748 | A | 6/1999 |

* cited by examiner

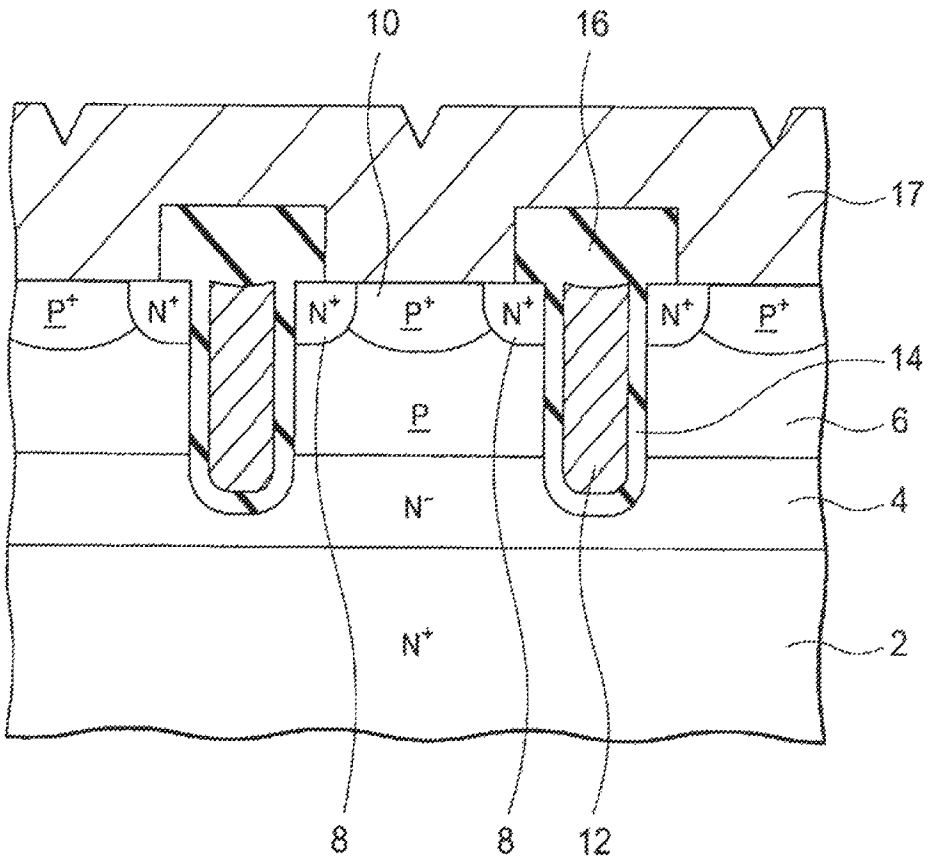
PRIOR ART
FIG. 2
AMENDED

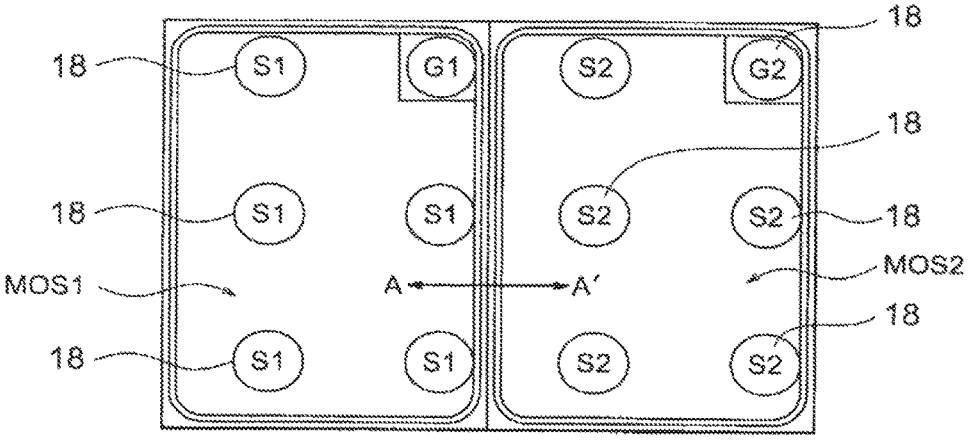
PRIOR ART
FIG. 3
AMENDED

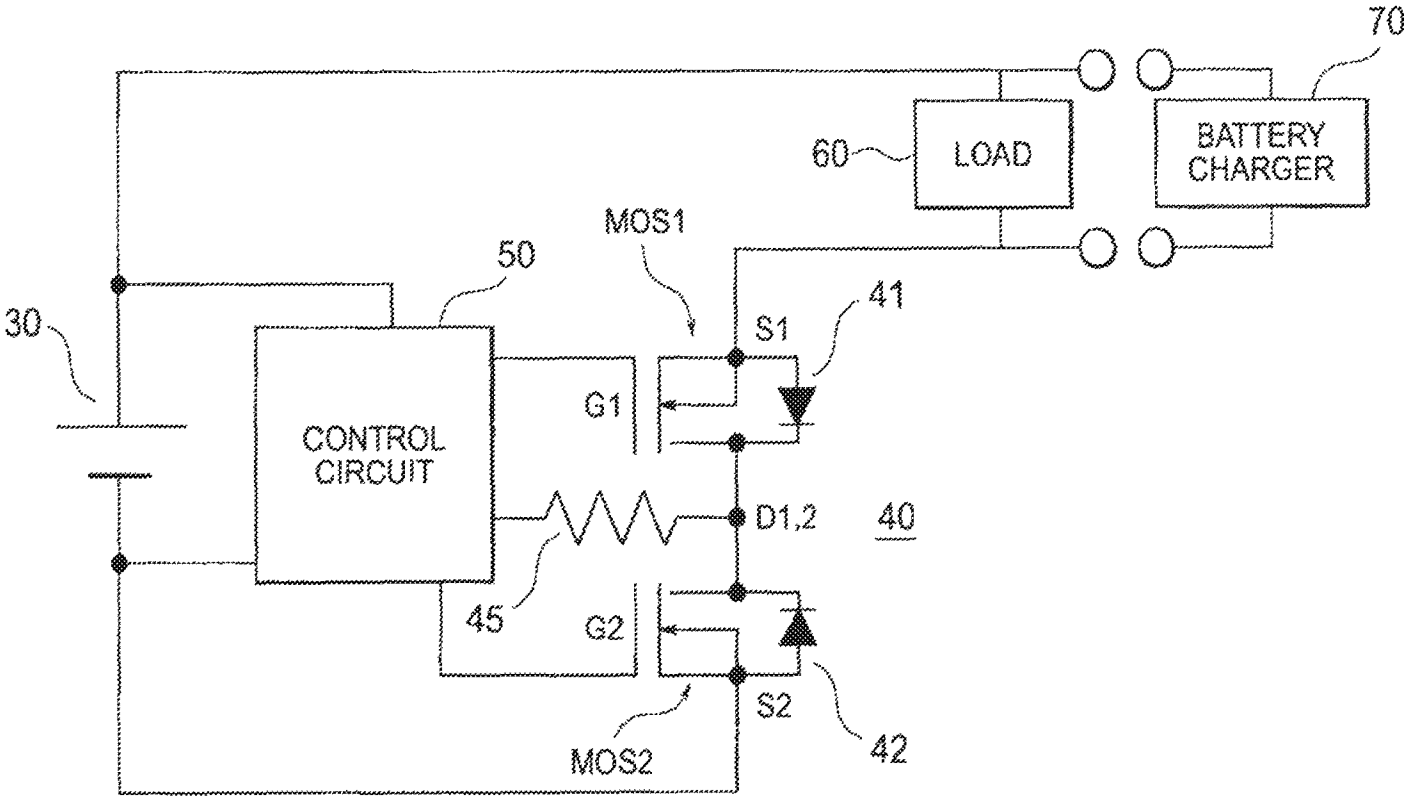
PRIOR ART
FIG. 5
AMENDED (a) DISCHARGE
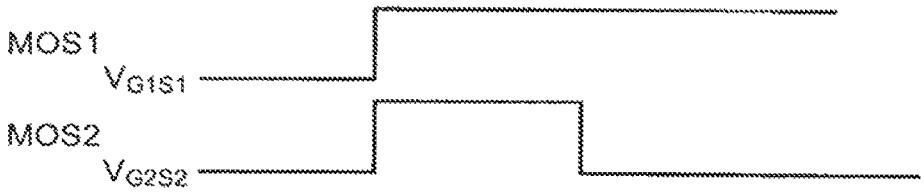
(b) CHARGE
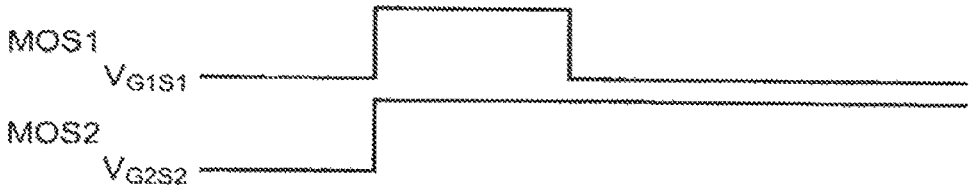
PRIOR ART
FIG. 6
AMENDED

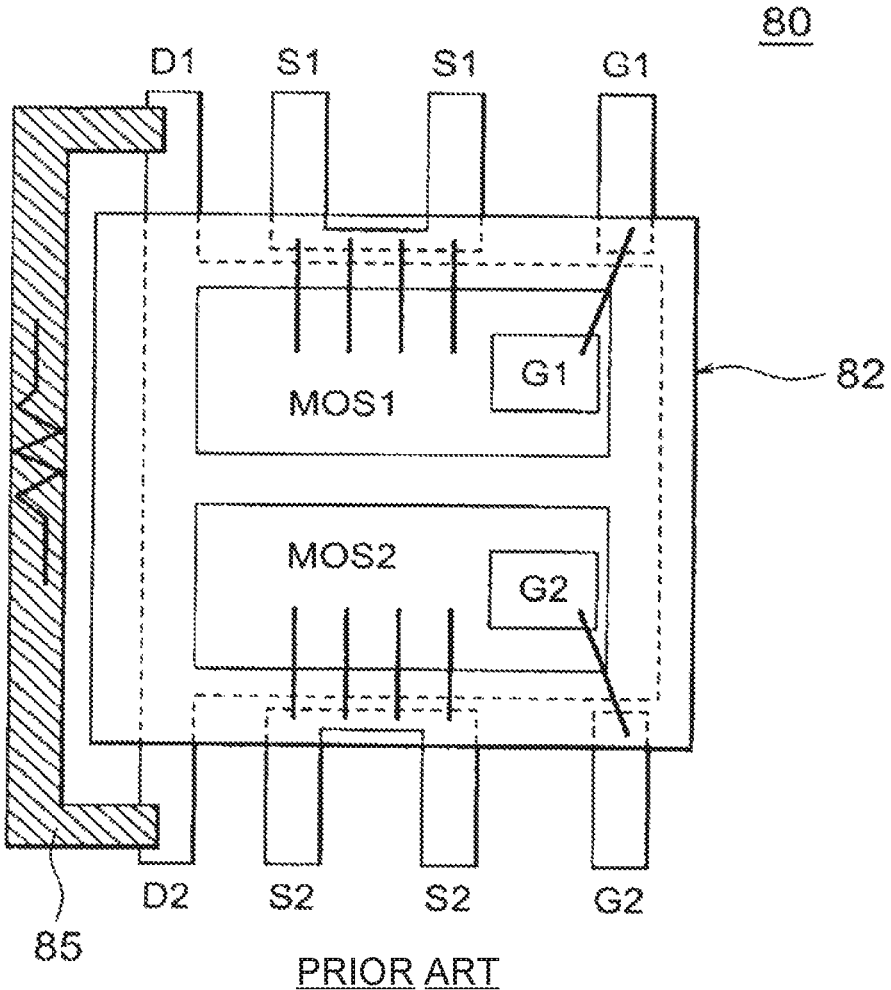
PRIOR ART
FIG. 7
AMENDED

MOS SEMICONDUCTOR DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is based upon and claims the benefit of priority from the prior Japanese Patent Application No. 2001-293928, filed on Sep. 26, 2001, the entire contents of which are incorporated herein by reference.

BACKGROUND OF THE INVENTION

1. Field of the Invention

The present invention relates to semiconductor devices. In particular, the present invention relates to a semiconductor device including a plurality of MOS transistors, drains of which are commonly connected.

2. Related Background Art

As shown in FIG. 5, a lithium battery 30 typically is connected with a protection circuit 40 for protecting the lithium battery 30 at the time of charging/discharging. Generally, the protection circuit 40 includes two MOS transistors MOS1 and MOS2, drains of which are commonly connected, diodes 41 and 42 connected in parallel to the respective MOS transistors, and a protection resistor 45, and is controlled by a control circuit 50 based on the potential across the lithium battery 30.

When the lithium battery 30 is discharged, a load 60 connected in series with the protection circuit 40 is disconnected from a battery charger 70. In this state, the control circuit 50 controls the protection circuit 40 so that a potential at an "H" level is applied to gates G1 and G2 of the MOS transistors MOS1 and MOS2, and after the potential of the lithium battery 30 becomes below a predetermined level, the potential of the gate G2 of the MOS transistor MOS2 is lowered to an "L" level, as shown in FIG. 6(a). When the lithium battery 30 is charged, the load 60 is connected in parallel with the battery charger 70. In this state, the control circuit 50 controls the protection circuit 40 so that a potential at the "H" level is applied to the gates G1 and G2 of the MOS transistors MOS1 and MOS2, and after the potential of the lithium battery 30 becomes below the predetermined level, the potential of the gate G1 of the MOS transistor MOS1 is lowered to the "L" level.

The protection circuit 40 having the above-described structure is sealed with mold resin on a common drain frame 85 to form a package 80, as shown in FIG. 7. Each of the MOS transistors MOS1 and MOS2 constituting the protection circuit 40 has a plurality of source terminals, as shown in FIG. 7. Generally, a package sealed with mold resin is thick.

Recently, as mobile devices including lithium batteries therein have become more compact, thinner, and lighter, it has been strongly requested that the size of MOS transistors be reduced. Under the circumstances, CSPs (Chip Size Packages) have received attention as being the thinnest type of packages, which can replace rather-thick conventional packages sealed with mold resin.

As shown in FIG. 3, a CSP typically has such features that dicing is not performed between two MOS transistors MOS1 and MOS2, and that solder balls 18 serving as electrodes are formed on the chip, which are connected to a gate G1 and sources S1 of the MOS transistor MOS1, and a gate G2 and sources S2 of the MOS transistor MOS2. CSPs having such a structure are expected to become the mainstream semiconductor devices for lithium battery protection circuits, since the height of such CSPs is considerably reduced as compared with conventional devices.

FIG. 4 shows a section view of a semiconductor device having the above-described CSP structure, taken along line A-A' of FIG. 3. This semiconductor device has a plurality of N-channel MOS transistors having a trench gate structure. In this semiconductor device, an $N^-$ epitaxial layer 4 having a high resistance is formed on an $N^+$ semiconductor substrate 2 serving as a drain; a P-type semiconductor layer 6 serving as a base is formed on the $N^-$ epitaxial layer 4; and a plurality of N-channel MOS transistors are formed in the P-type semiconductor layer 6. The structure of such MOS transistors will be described in detail with reference to FIG. 2, which is an enlarged view of the MOS transistors shown in FIG. 4.

As shown in FIG. 2, $N^+$ semiconductor regions 8, and $P^+$ semiconductor regions 10 for applying a predetermined potential to the P-type semiconductor layer 6 are formed near the surface of the P-type semiconductor layer 6. A $P^+$ semiconductor region 10 is formed near the surface of the P-type semiconductor layer 6 between two $N^+$ semiconductor regions 8 so as to contact the $N^+$ semiconductor regions 8. Further, the P-type semiconductor layer 6 includes trenches reaching the $N^-$ epitaxial layer 4, in which gate electrodes 12 are formed via insulating films 14, which are gate insulating films. An insulating film 16 is formed to cover each gate electrode 12. The insulating film 16 does not completely cover the $N^+$ semiconductor regions 8 serving as sources, but exposes part of the surface of the sources 8. A metal layer 17 is formed to cover the main surface of the substrate thus constituted. A predetermined potential is applied to the P-type semiconductor layer 6 and the $N^+$ semiconductor regions 8 via the metal layer 17.

When a predetermined potential is applied to the gate electrodes 12, electrons flow from the $N^+$ semiconductor regions 8 serving as the sources to the $N^+$ semiconductor substrate 2 serving as the drain, via the P-type semiconductor layer 6 serving as the base and the $N^-$ epitaxial layer 4, as shown in FIG. 4.

The MOS transistors MOS1 and MOS2 are isolated by an element isolation film 19, as shown in FIG. 4.

However, since the drain does not serve as an electrode in this CSP-structure semiconductor device as show in FIGS. 3 and 4, a current $I_{S1,S2}$ flows through the interface between the epitaxial layer 4 and the silicon semiconductor substrate 2, in the traverse direction from the transistor MOS1 side to the transistor MOS2 side. The reason for this is that although the resistivity of the silicon substrate 2 is about 3 mΩ·cm, which is a few hundred times lower than that of the epitaxial layer 4, the section area of the current path is small, and the traverse length of the chip is 1 mm or more, resulting in that the resistance value of the silicon substrate is increased. Due to such a feature, there is a problem in that ON resistance of this device is increased as compared with the case where a current flows in the vertical direction through each of the transistors MOS1 and MOS2 having the trench gate structure.

SUMMARY OF THE INVENTION

According to an embodiment of the present invention, a semiconductor device includes: a semiconductor substrate of a first conductive type; a first semiconductor layer of the first conductive type formed on a main surface of the semiconductor substrate, the impurity concentration of the first semiconductor layer being lower than that of the semiconductor substrate; a second and third semiconductor layers of a second conductive type formed on the first semiconductor layer, the second and third semiconductor layers being isolated from each other; a first MOS transistor of the first conductive type formed in the second semiconductor layer, the first semiconductor layer and the semiconductor substrate serving as drains of the first MOS transistor; a second MOS transistor of the first conductive type formed in the third semiconductor layer, the first semiconductor layer and the semiconductor substrate serving as drains of the second MOS transistor; and a conductive layer formed on a reverse surface of the semiconductor substrate.

BRIEF DESCRIPTION OF THE DRAWINGS

FIG. 2 is a section view showing the structure of a MOS transistor having a trench gate structure.

FIG. 3 is a top view of a CSP-structure semiconductor device.

FIG. 5 is a circuit diagram showing the structure of a lithium battery protection circuit.

FIGS. 6(a) and 6(b) show waveforms of signals applied to gates of MOS transistors constituting a lithium battery protection circuit.

FIG. 7 is a diagram showing a package of a lithium battery protection circuit.

DESCRIPTION OF THE EMBODIMENTS

Figure 1:
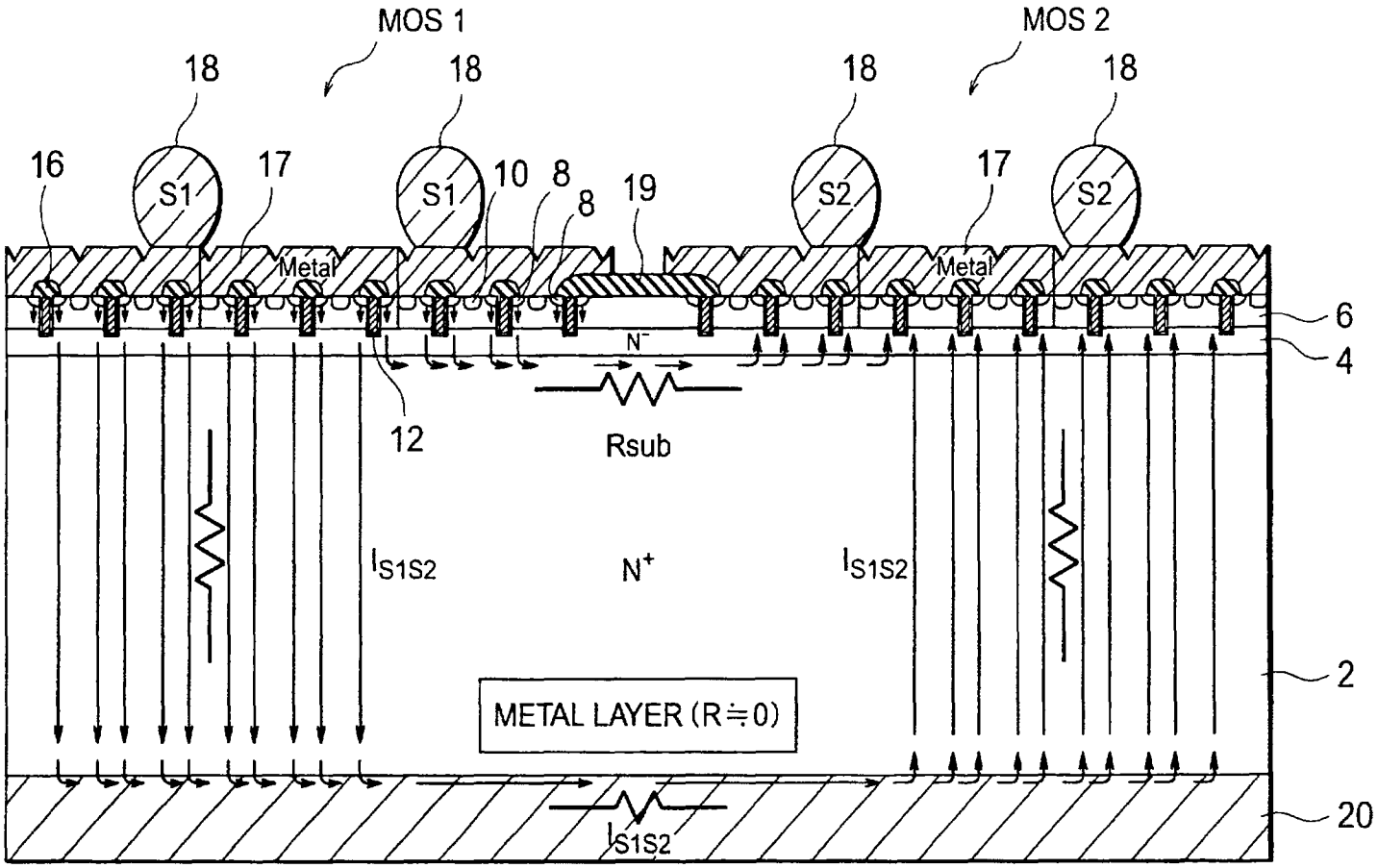
FIG. 1 is a section view showing the structure of a semiconductor device according to an embodiment of the present invention.
Figure 4:
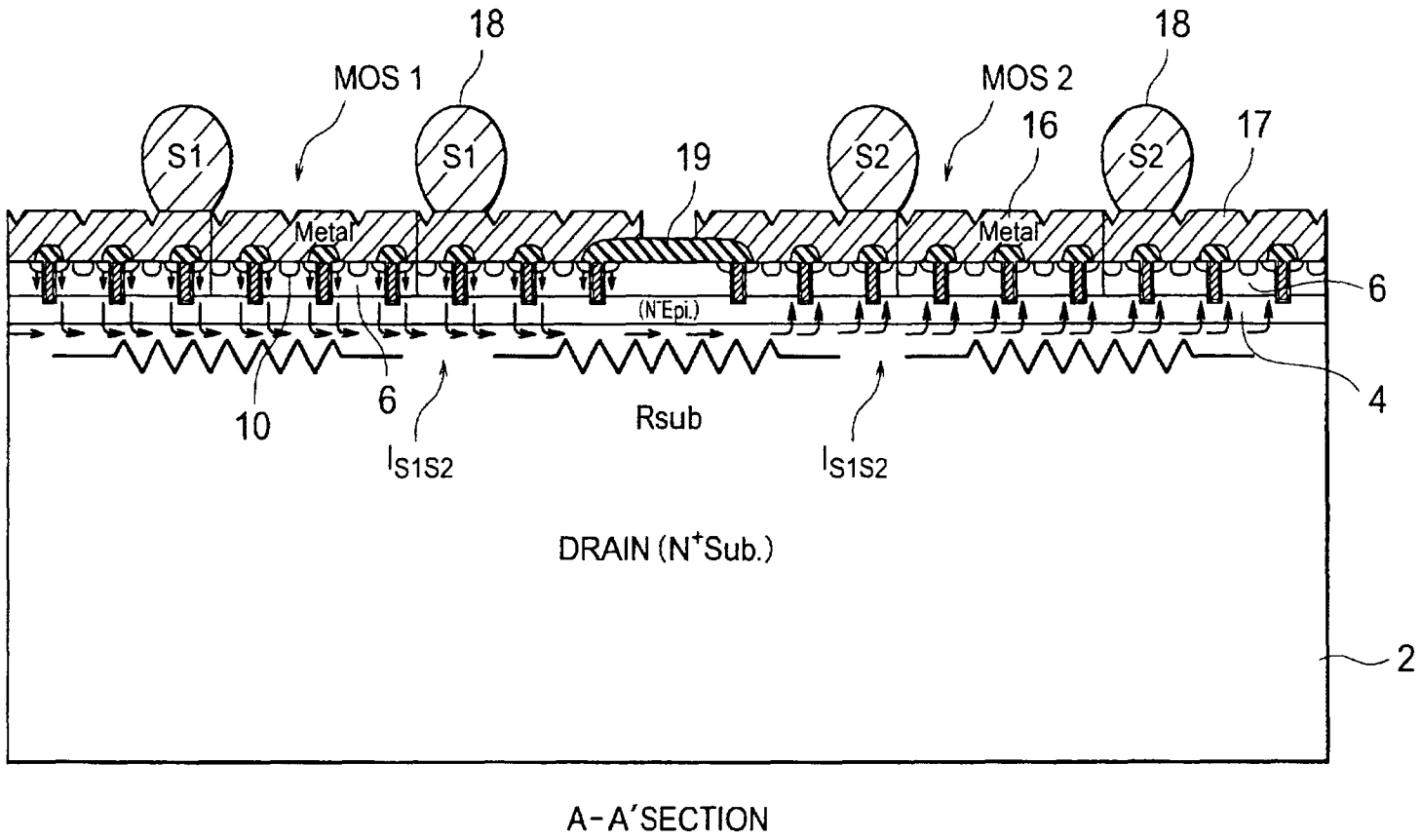
FIG. 4 PRIOR ART
FIG. 4 is a section view showing the structure of a conventional semiconductor device.

FIG. 1 shows the structure of a semiconductor device according to an embodiment of the present invention. The semiconductor device of this embodiment is obtained by forming a conductive layer 20 having a low resistance on the reverse side, i.e., the side opposite to the side on which the MOS transistors are formed, of the semiconductor substrate 2 of the conventional semiconductor device shown in FIGS. 3 and 4.

That is, in the semiconductor device of this embodiment, an $N^-$ epitaxial layer 4 having a high resistance is formed on an $N^+$ semiconductor substrate 2 serving as a drain; a P-type semiconductor layer 6 serving as a base is formed on the $N^-$ epitaxial layer 4; and a plurality of N-channel MOS transistors (two in the drawing) having a trench gate structure are formed in the P-type semiconductor layer 6. The structure of the MOS transistors MOS1 and MOS2 will be described in detail below with reference to FIG. 2, which is an enlarged view of the MOS transistor shown in FIG. 1.

As shown in FIG. 2, $N^+$ semiconductor regions 8, and $P^+$ semiconductor regions 10 for applying a predetermined potential to the P-type semiconductor layer 6 are formed near the surface of the P-type semiconductor layer 6. A $P^+$ semiconductor region 10 is formed near the surface of the P-type semiconductor layer 6 between two $N^+$ semiconductor regions 8 so as to contact the $N^+$ semiconductor regions 8. Further, the P-type semiconductor layer 6 includes trenches reaching the $N^-$ epitaxial layer 4, in which gate electrodes 12 are formed via insulating films 14, which are gate insulating films. An insulating film 16 is formed to cover each gate electrode 12. The insulating film 16 does not completely cover the $N^+$ semiconductor regions 8 serving as sources, but exposes part of the surface of the sources 8. A metal layer 17 is formed to cover the main surface of the substrate thus constituted. A predetermined potential is applied to the P-type semiconductor layer 6 and the $N^+$ semiconductor regions 8 via the metal layer 17. The MOS transistors MOS1 and MOS2 are isolated by an element isolation film 19, as shown in FIG. 1. Accordingly, the metal layer 17 on the MOS transistors MOS1 and MOS2 is discontinued over the element isolation film 19. Solder balls 18 for drawing source electrodes are formed on the metal layer 17. In addition, as in the case of the conventional device shown in FIG. 3, the gate electrodes 12 of the MOS transistors MOS1 and MOS2 are commonly connected with the solder balls G1 and G2, respectively.

When a predetermined potential is applied to the gate electrodes 12 of the MOS transistors MOS1 and MOS2 via the solder balls G1 and G2, carriers move from the $N^+$ semiconductor regions 8 serving as sources of the transistor MOS1 to the MOS transistor MOS2 via the P-type semiconductor layer 6 serving as the base, the $N^-$ epitaxial layer 4, the $N^+$ semiconductor substrate 2 serving as the drain, and the conductive layer 20.

A low-resistance metal having a thickness of a few mm is used as the conductive layer 20. Typical materials of the conductive layer 20 are, vanadium-nickel-gold (V—Ni—Au), aluminum, etc. It is preferable that the conductive layer 20 is formed before the solder balls 18 are formed.

As shown in FIG. 1, in this embodiment, around the connection point of the transistors MOS1 and MOS2, a current flows through the interface between the epitaxial layer 4 and the semiconductor substrate 2 in the traverse direction from the MOS1 side to the MOS2 side, as in the case of the conventional device. However, in other portions, a current flows in the vertical direction toward the drain at the lower side because of the existence of a low-resistance conductive layer (metal layer) 20. This change in current path is determined by the difference in resistance value between the case where the current flows horizontally and the case where the current flows vertically. The current flows through the path with which the resistance value is smaller.

Since the resistance value in the conductive layer 20 is substantially zero, the current having reached the conductive layer 20 horizontally flows toward the portion below the transistor MOS2 without loss, and then vertically flows toward the sources of the transistor MOS2.

In this embodiment, since the current flows in the above-described manner, the ON resistance is substantially the same as that in the case where a current passes vertically through each of the transistors MOS1 and MOS2. Accordingly, the problem in the conventional devices that the ON resistance is increased can be solved in the present invention. Further, since the present invention is a semiconductor device having the CSP structure, it is possible to reduce the thickness.

Thus, in a semiconductor device having the CSP structure with two MOS transistors, it is possible to change the current path from the horizontal direction around the interface of the semiconductor substrate 2 to the vertical direction by forming a low-resistance metal layer 20 in the drain side, which is not used as an electrode. In this way, it is possible to reduce the ON resistance, thereby achieving the ON-resistance substantially identical to the ON resistance in the case where each of the two MOS transistors is independently operated.

Although N-channel MOS transistors (MOSFETS) having a trench gate structure are used in this embodiment, the present invention can be applied to P-channel MOSFETs having the opposite polarity. Further, the present invention can be applied to planar MOSFETs, having a different structure. In addition, although the present invention has been described taking the case where a current flows from the sources S1 of the MOS transistor MOS1 to the sources S2 of the MOS transistor MOS2 as an example, the same advantageous effects can be obtained if the current flows in the opposite direction.

As described above, according to the present invention, it is possible to prevent the increase in ON-resistance, and to fabricate a semiconductor device whose package is thinner.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:

a semiconductor substrate of a first conductive type;

a first semiconductor layer of the first conductive type formed on a main surface of said semiconductor substrate, an impurity concentration of said first semiconductor layer being lower than that of said semiconductor substrate;

second and third semiconductor layers of a second conductive type formed on said first semiconductor layer*;* a first MOS transistor of the first conductive type including first source regions formed in said second semiconductor layer, said first semiconductor layer and said semiconductor substrate serving as drains of said first MOS transistor;

a first metal layer electrically connected to said first source regions a second MOS transistor of the first conductive type including second source regions[;] formed in said third semiconductor layer, said first semiconductor layer and said semiconductor substrate serving as drains of said second MOS transistor;

a second metal layer electrically connected to said second source regions, said second metal layer being isolated from said first metal layer; and a conductive layer formed on a reverse surface of said semiconductor substrate*;*

*wherein the conductive layer forms a current flow path from the first MOS transistor to the second MOS transistor.*

2. The semiconductor device according to claim 1, wherein:

said first MOS transistor includes a gate electrode formed, via a gate insulating film, in a trench formed in said second semiconductor layer so as to reach said first semiconductor layer, and said first source regions provided near a surface of said second semiconductor layer at both sides of said trench, said first source regions contacting said trench; and said second MOS transistor includes a gate electrode formed, via a gate insulating film, in a trench formed in said third semiconductor layer so as to reach said first semiconductor layer, and said second source regions provided near a surface of said third semiconductor layer at both sides of said trench, said second source regions contacting said trench.

3. The semiconductor device according to claim 2, wherein:

each of said first and second MOS transistors includes a plurality of said gate electrodes and a respective plurality of said first and second source regions;

said first and second source regions of said first and second MOS transistors are covered by respective first and second metal layers; and solder balls for drawing source electrodes are formed on *each of* the [common] metal layers.

4. The semiconductor device according to claim 3, wherein said gate electrodes [of each] of said first [and second] MOS [transistors] *transistor* are commonly connected *to each other and said gate electrodes of said second MOS transistor are commonly connected to each other.*

5. The semiconductor device according to claim 3, further comprising:

a fourth semiconductor layer of the second conductive type, provided near a surface of said second semiconductor layer between adjacent gate electrodes of said first MOS transistor and between said first source regions corresponding to the adjacent gate electrodes, an impurity concentration of said fourth semiconductor layer being higher than that of said second semiconductor layer; and a fifth semiconductor layer of the second conductive type, provided near a surface of said third semiconductor layer between adjacent gate electrodes of said second MOS transistor and between said second source regions corresponding to the adjacent gate electrodes, impurity concentration of said fifth semiconductor layer being higher than that of said third semiconductor layer.

6. The semiconductor device according to claim 5, wherein said fourth and fifth semiconductor layers are covered by said respective first and second metal layers.

7. The semiconductor device according to claim 1, wherein said first semiconductor layer is an epitaxial layer.

8. The semiconductor device according to claim 1, wherein said conductive layer is formed of a vanadium-nickel-gold alloy or aluminum.

9. The semiconductor device according to claim 2, wherein the gate electrode of the first MOS transistor is electrically isolated from the gate electrode of the second MOS transistor.

*10. The semiconductor device according to claim 1, wherein said first metal layer is over a gate electrode of the first MOS transistor and spaced from the gate electrode of the first MOS transistor by an insulating film.*

*11. The semiconductor device according to claim 2, wherein the gate electrode of said first MOS transistor extends inwardly of said second semiconductor layer, and the gate electrode of said second MOS transistor extends inwardly of the said third semiconductor layer.*

*12. The semiconductor device according to claim 11, wherein the gate electrode of said first MOS transistor extends through said second semiconductor layer, and the gate electrode of said second MOS transistor extends through the third semiconductor layer.*

*13. The semiconductor device according to claim 1, wherein the first conductive type is n type.*

*14. The semiconductor device according to claim 10, further comprising a first insulating layer overlying the gate electrode of the first MOS transistor and a portion of the first source regions, wherein said first conductive metal layer is isolated from the gate electrode of the first MOS transistor*

*by the first insulating layer, and contacts the first source regions in a location adjacent to the first insulating layer.*

*15. The semiconductor device according to claim 14, further comprising a second insulating layer located over the second semiconductor layer and the third semiconductor layer, wherein the first conductive metal layer and the second conductive metal layers are separated from one another by the second insulating layer.*

*16. The semiconductor device according to claim 1, wherein said second semiconductor layer extends from the first MOS transistor to the second MOS transistor.*

*17. A semiconductor device comprising:*

*a semiconductor substrate of a first conductive type having a main surface and a reverse surface;*

*a first semiconductor layer of the first conductive type formed on the main surface of said semiconductor substrate, an impurity concentration of said first semiconductor layer being lower than that of said semiconductor substrate;*

*second and third semiconductor layers of a second conductive type formed on said first semiconductor layer;*

*a first MOS transistor of the first conductive type including first source regions formed in said second semiconductor layer, said first semiconductor layer and said semiconductor substrate serving as drains of said first MOS transistor;*

*a first metal layer electrically connected to said first source regions*

*a second MOS transistor of the first conductive type including second source regions formed in said third semiconductor layer, said first semiconductor layer and said semiconductor substrate serving as drains of said second MOS transistor, said second and third semiconductor layers being adjacent to each other on the first semiconductor layer;*

*a second metal layer electrically connected to said second source regions, said second metal layer being isolated from said first metal layer; and*

*a conductive layer formed on the reverse surface of said semiconductor substrate.*

*18. The semiconductor device of claim 17, wherein the conductive layer forms a current flow path from the first MOS transistor to the second MOS transistor.*

*19. The semiconductor device of claim 18, said first MOS transistor includes a gate electrode formed, via a gate insulating film, in a trench formed in said second semiconductor layer so as to reach said first semiconductor layer, and said first source regions are provided near a surface of said second semiconductor layer at both sides of said trench, said first source regions contacting said trench; and*

*said second MOS transistor includes a gate electrode formed, via a gate insulating film, in a trench formed in said third semiconductor layer so as to reach said first semiconductor layer, and said second source regions are provided near a surface of said third semiconductor layer at both sides of said trench, said second source regions contacting said trench.*

*20. The semiconductor device of claim 19, wherein the first metal layer overlies the gate electrode of the first MOS transistor and is separated from the gate electrode of the first MOS transistor by an insulating film.*

* * * * *